United States Patent [19]
Miyazaki et al.

[11] Patent Number: 5,919,603
[45] Date of Patent: Jul. 6, 1999

[54] PROCESS FOR PRODUCING PRINTED WIRING BOARD

[75] Inventors: Masashi Miyazaki, Hadano; Haruo Akahoshi, Hitachi; Shozo Nohara; Kenzi Kikuta, both of Hadano; Toshiaki Ishimaru, Hitachi, all of Japan

[73] Assignee: Hitachi, Ltd., Tokyo, Japan

[21] Appl. No.: 08/967,196

[22] Filed: Oct. 29, 1997

Related U.S. Application Data

[63] Continuation of application No. 08/459,944, Jun. 2, 1995, abandoned, which is a continuation of application No. 08/112,337, Aug. 27, 1993, Pat. No. 5,438,751.

[30] Foreign Application Priority Data

Aug. 28, 1992 [JP] Japan ................................ 4-229692

[51] Int. Cl.$^6$ .............................. G03C 1/725; C08J 3/28
[52] U.S. Cl. ...................... 430/281.1; 522/117; 522/121; 522/173; 522/178; 522/182; 522/183; 526/302; 526/308; 526/313; 526/320; 526/323.2
[58] Field of Search ...................... 522/117, 121, 522/173, 178, 182, 183; 430/281.1; 526/302, 308, 313, 320, 323.2

[56] References Cited

U.S. PATENT DOCUMENTS

| | | | |
|---|---|---|---|
| Re. 21,737 | 3/1941 | Kistler et al. | 526/318.4 |
| 2,884,336 | 4/1959 | Loshaek et al. | 526/318.4 |
| 4,181,752 | 1/1980 | Martens et al. | 526/318.4 |
| 4,196,272 | 4/1980 | Goretta et al. | 526/318.4 |
| 4,268,614 | 5/1981 | Keyama et al. | |
| 4,632,897 | 12/1986 | Barzynski et al. | 522/121 |
| 4,692,396 | 9/1987 | Uchida | 522/121 |
| 5,700,576 | 12/1997 | Brehm et al. | 522/121 |

FOREIGN PATENT DOCUMENTS

| | | | |
|---|---|---|---|
| 0107047 | 10/1974 | Japan | 522/121 |
| 0097416 | 8/1978 | Japan | 522/121 |
| 54-133322 | 10/1979 | Japan | 526/318.4 |
| 56-145907 | 11/1981 | Japan | 526/318.4 |
| 61-213213 | 9/1986 | Japan | 522/121 |
| 61-262736 | 11/1986 | Japan | 522/121 |
| 1668369 | 8/1991 | U.S.S.R. | 526/318.4 |

OTHER PUBLICATIONS

Printed Circuit World Convention 2, Jun. 5, 1987, Tokyo, Japan, p. WC–68, K. Masui, et al "Resist for Photo–Additive Printed Wiring Boards".
Database WPI, Week 9003, Derwent Publications Ltd., London, GB;.
Patent Abstracts of Japan, vol. 13, No. 180 (P–864) Apr. 27, 1989.

*Primary Examiner*—Bernard Lipman
*Assistant Examiner*—N. Sarofim
*Attorney, Agent, or Firm*—Antonelli, Terry, Stout & Kraus, LLP

[57] ABSTRACT

In an additive process for producing printed wiring boards, by using a developer comprising a chlorine-free organic solvent and an alkaline aqueous solution and as a resist material a copolymer of methacrylic acid and methyl methacrylate or the like, the production steps are simplified even if a substrate having a large area is used, and abolishment of chlorine-containing organic solvent as a developer becomes possible.

13 Claims, 3 Drawing Sheets

PROCESS FOR PRODUCING PRINTED WIRING BOARD

This application is a Continuation application of application Ser. No. 08/459,944, filed Jun. 2, 1995, abandoned which application is a Continuation application of application Ser. No. 08/112,337, filed Aug. 27, 1993 (now U.S. Pat. No. 5,438,751).

BACKGROUND OF THE INVENTION

This invention relates to a process for producing a printed wiring board having fine patterns thereon, particularly to a process for producing a printed wiring substrate by a pattern copper plating method without using a chlorine-containing organic solvent as a developer and easy for peeling a plating resist used therein.

In the production of printed wiring substrates, there have been used resist materials, which are used as plating resists for fine pattern formation in a pattern plating method, suitable for development with a chlorine-containing developer such as 1,1,1-trichloroethane. Such a process for producing a printed wiring board is disclosed, for example, in a report "Resist for Photo-additive Printed Wiring Boards", by K. Masui et al, in "Printed Circuit World Convention IV, Technical Paper WC 1V-68, June 2 to 5 (1987)".

But in such a prior art technique, when an alkali-soluble plating resist is used in the case of conducting chemical copper plating as pattern copper plating, there arises a problem in that resistance to plating solution is poor since said chemical copper plating bath is strongly alkaline (pH 12–13), that is, resistance to plating bath is poor. Such a problem can almost be solved by conducting a curing treatment of the film after resist pattern formation. But in a semiadditive process, when the plating resist is subjected to the curing treatment, removal of the plating resist after formation of etching resist on patterned copper plating becomes very difficult.

When a plating resist suitable for developing with 1,1,1-trichloroethane is used, the problems of the poor resistance to plating bath and the removal of resist can be solved. But the use of 1,1,1-trichloroethane causes a problem of the depletion of the earth's protective ozone layer.

SUMMARY OF THE INVENTION

It is an object of the present invention to provide a process for producing a printed wiring board by a pattern plating method suitable for forming fine patterns on a substrate having a large area overcoming the problems of prior art, without using a chlorine-containing organic solvent such as 1,1,1-trichloroethane as a developer, while easy for peeling a plating resist.

The present invention provide a process for producing a printed wiring board which comprises forming a photoresist film on a substrate, exposing the photoresist film to ultraviolet light, developing the photoresist film with a developer to form a resist pattern, and conducting copper plating using the resist pattern as a plating resist to form a wiring pattern, said photoresist film being prepared by using a resist material which is developable with a developer comprising a chlorine-free organic solvent and an alkaline aqueous solution.

In the above-mentioned process, the plating resist can be used as a permanent resist.

Further, the photoresist film can be formed on a copper-clad substrate.

In addition, the copper plating can be conducted either by electroless (or chemical) copper plating or electric copper plating.

DESCRIPTION OF THE PREFERRED EMBODIMENTS

Figure 1:
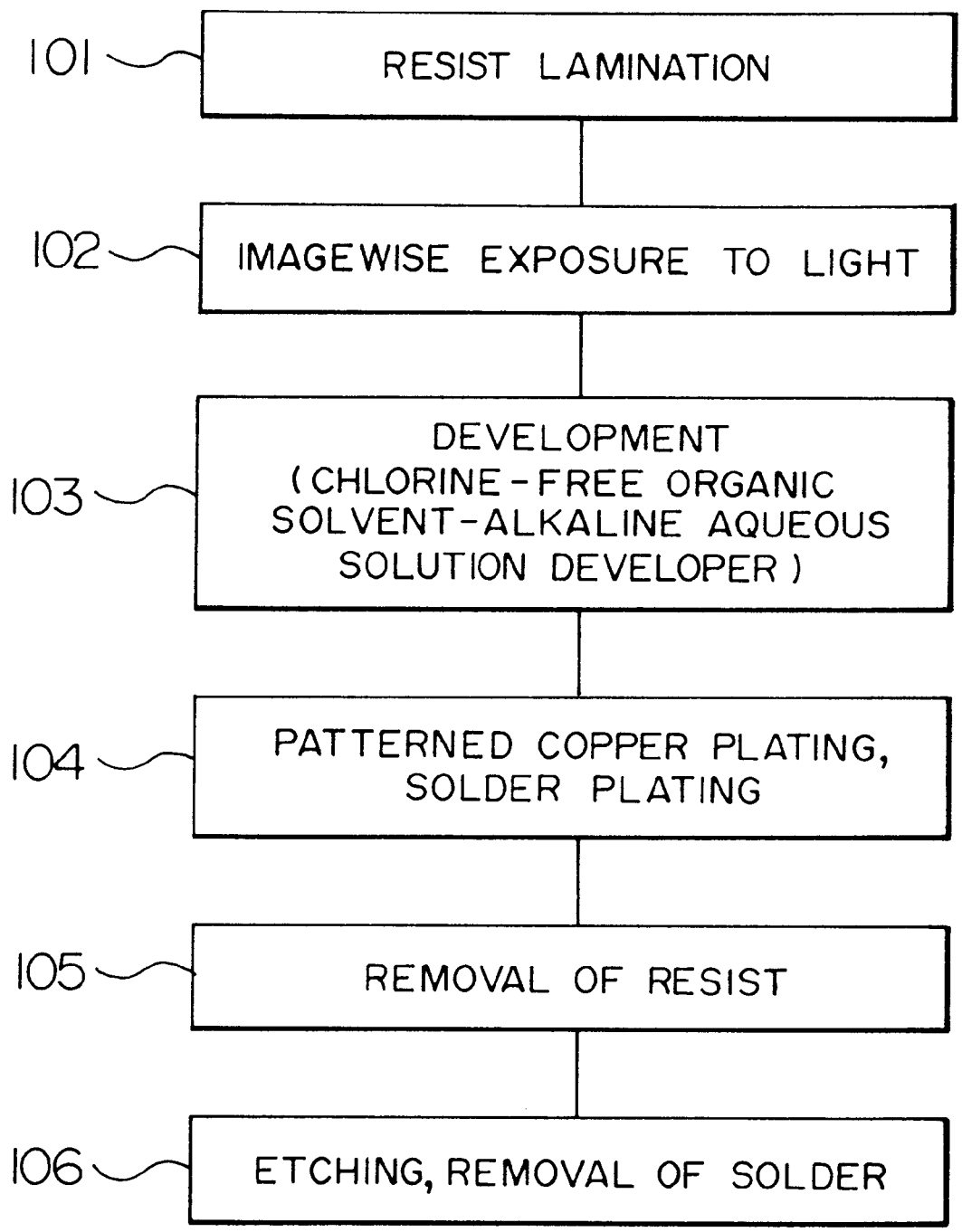
FIG. 1 is a flow diagram explaining the process for producing a printed wiring board according to the present invention.

The process for producing a printed wiring board of the present invention comprises forming a photoresist film on a substrate, exposing the photoresist film to ultraviolet light, developing the photoresist film with a developer to form a resist pattern, and conducting copper plating using the resist pattern as a plating resist to form a wiring pattern, said photoresist film being prepared by using a resist material which is developable with a developer comprising a chlorine-free organic solvent and an alkaline aqueous solution.

As the resist material for forming a photoresist film forming a plating resist, it should be developable with a developer comprising a chlorine-free organic solvent and an alkaline aqueous solution and it does not inhibit the stability of a copper plating bath for forming wiring patterns and the stability of plating reaction. Further, as the resist material, it is preferable to use a material which is not dissolved in an alkaline aqueous solution at 80° C. or less, or the thermal expansion coefficient of the material is $1 \times 10^{-4}$ or less and the swelling with a plating solution is 10% or less in order to maintain reliability of dimensional precision of wiring patterns.

As the resist material, it is preferable to use a material comprising mainly a copolymer of methyl methacrylate and methacrylic acid. The content of methacrylic acid in the copolymer of methyl methacrylate and methacrylic acid is preferably 1.0 to 11 parts by weight, more preferably 1.5 to 10 parts by weight per 100 parts by weight of the copolymer. When the content of methacrylic acid is too much in the case of conducting electroless copper plating as copper plating, there is a tendency to lower resistance to plating of plating resist. On the other hand, when the content of methacrylic acid is too small, there is a tendency to fail to be developed with a developer comprising a chlorine-free organic solvent and an alkaline aqueous solution.

In the case of forming a photoresist film on a copper foil laminated on one or both surfaces of the substrate, and the wiring pattern is formed by conducting copper plating using a resist pattern as a plating resist, forming an etching resist on the plated copper, peeling the plating resist with a non-aqueous solution such as methylene chloride, etc. and etching the copper foil on the substrate, it is preferable to make the content of methacrylic acid 1.5 to 6 parts by weight per 100 parts by weight of the copolymer. Since methacrylic acid is hydrophilic, it is preferable to make the content 6 parts by weight or less considering poor compatibility with the non-aqueous solvent.

Further, in the case of peeling the plating resist with a mixed solvent comprising an alkaline aqueous solution and chlorine-free organic solvent, it is preferable to make the content of methacrylic acid 4 to 10 parts by weight. When the content of methacrylic acid is less than 4 parts by weight, the penetration of the alkaline aqueous solution into the resist becomes difficult, since only the methacrylic acid moiety is hydrophilic in the resist.

The resist material contains as a major component the copolymer of methyl methacrylate and methacrylic acid, and further contains one or more photosensitive monomers, photosensitizers which produce free radicals upon exposure to actinic light, adhesion accelerating agents and the like in amounts exhibiting their effects.

Examples of the photosensitive monomers are allyloxylated cyclohexyl diacrylate, bis(acryloxy ethyl) hydroxyethylisocyanurate, bis(acryloxy neophentyldiglycol) adipate, ethylene oxide modified bisphenol A diacrylate, ethylene oxide modified bisphenol S diacrylate, bisphenol A dimethacrylate, ethylene oxide modified bisphenol A dimethacrylate, ethylene oxide modified bisphenol F diacrylate, 1,4-butanediol diacrylate, 1,4-butanediol dimethacrylate, 1,3-butyleneglycol diacrylate, 1,3-butyleneglycol dimethacrylate, dicyclopentanyl diacrylate, diethyleneglycol diacrylate, diethyleneglycol dimethacrylate, ethylene oxide hydroxy modified diethyleneglycol dimethacrylate, dipentaerythritol hexaacrylate, dipentaerythritol monohydroxy pentaacrylate, etc.

Examples of the photosensitizer are 2-ethylanthraquinone, 2-t-butylanthraquinone, octamethylanthraquinone, octaethylanthraquinone, 1,2-benzanthraquinone, 2,3-diphenylanthraquinone, etc.; ketoaldonyl compounds such as diacetyl, benzyl, etc.; α-ketaldonyl alcohols such as benzoin, pivalone, etc.; ethers; α-hydrocarbon substituted aromatic acyloins such as α-phenylbenzoine, α,α-diethoxyacetophenone, etc.; aromatic ketones such as benzophenone, 4,4'-bisdialkylaminobenzophenones, etc.

Examples of the adhesion accelerating agent are benzotriazole, bipyridyl, mercaptobenzothiazole, imidazole compounds, thiol compounds, etc.

As the developer for plating resist prepared by using such a resist material, there can be used a mixed solvent comprising a chlorine-free organic solvent and an alkaline aqueous solution. Examples of the chlorine-free organic solvent are water-soluble ethylene glycol ethers such as diethylene glycol monobutyl ether, ethylene glycol monobutyl ether, etc.; propylene glycol ethers such as propylene glycol methyl ether, dipropylene glycol methyl ether, tripropylene glycol methyl ether, etc.

As the alkaline aqueous solution, there can be used those obtained by dissolving an alkaline component such as $Na_2B_4O_7$, $K_2B_4O_7$, NaOH, $Na_2CO_3$, $K_2CO_3$, $Na_2SiO_3$, $Na_3PO_4$, etc. in water such as deionized water. A preferable example of the developer is an alkaline aqueous solution obtained by dissolving $Na_2B_4O_7 \cdot 10H_2O$ and an ethylene or propylene glycol ether in deionized water. Preferable mixing ratios of the these components are as follows:

| | |
|---|---|
| Alkali such an $Na_2B_4O_7 \cdot 10_2O$ | 3–15 g/l. |
| Ethylene or propylene glycol ether | 70–900 ml/l. |
| water | necessary for making the total amount 1 liter |

As the solution for peeling the plating resist, there can be used conventionally used non-aqueous solutions such as methylene chloride, dichloromethane, etc.; a mixed solvent comprising a chlorine-free organic solvent and an alkaline aqueous solution (the same one as used as the developer mentioned above); and a mixed solvent comprising a chlorine-free organic solvent, an alkaline aqueous solution and one or more amine compounds such as monoethanolamine, etc.

The process for producing printed wiring boards of the present invention can be attained by a so-called additive process, either by a full-additive process or a semi-additive process.

For example, in the case of the full-additive process, the plating resist is used as a permanent resist.

In the case of the semi-additive process, the resist pattern is formed on a copper foil laminated on a substrate and the wiring pattern is formed by conductive copper plating using the resist pattern as a plating resist, forming an etching resist on the plated copper, peeling the plating resist and etching the copper foil on the substrate.

The above-mentioned copper plating can be conducted either by electroless copper plating or electric copper plating.

According to process of the present invention, since a developer comprising a chlorine-free organic solvent and an alkaline aqueous solution, that is, non-chlorine aqueous developer is used as a developer for plating resist, even if pattern copper plating is conducted by electroless copper plating, a curing treatment of the resist film as in the case of using an alkali-soluble type plating resist can be omitted.

By this, the production steps can be simplified and the removal of the resist, i.e. solder plating film as an etching resist after formation on the pattern copper plating, becomes easy.

In addition, since no 1,1,1-trichloroethane is used as a developer in contrast to prior art technique, it is possible to prevent the depletion of the earth's protective ozone layer.

The present invention is illustrated by way of the following Examples, in which all percents and parts are by weight unless otherwise specified.

EXAMPLE 1

One example of the process of the present invention is explained referring to FIGS. 1 and 2.

FIG. 1 is a flow diagram illustrating one example of major steps for producing a printed wiring board according to the present invention. FIGS. 2A to 2F are cross-sectional views of main portions of printed wiring board corresponding to the flow diagram of FIG. 1.

The constitution of the printed wiring board is explained referring to FIGS. 2A to 2F.

The printed wiring board of this Example was produced by a semi-additive process, wherein a photoresist 4 was formed on a copper foil 2 laminated on a substrate 1, and ultraviolet light irradiation using a photomask, pattern copper plating treatment and etching treatment were conducted to form copper wiring by pattern copper plating 3.

Figure 2A:
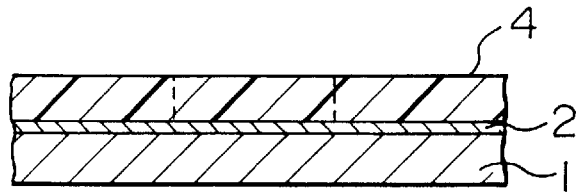
FIGS. 2A to 2F are cross-sectional views for explaining the process of the present invention by a semiadditive process corresponding to FIG. 1.

More in detail, on a copper foil 2 formed on a substrate 1 (for example, glass-epoxy), a photoresist 4 was formed by laminating a dry film resist made from a copolymer of methyl methacrylate and methacrylic acid (methacrylic acid content: 4 to 6 parts per 100 parts of copolymer) as shown in FIG. 2A (step 101 in FIG. 1).

Figure 2B:
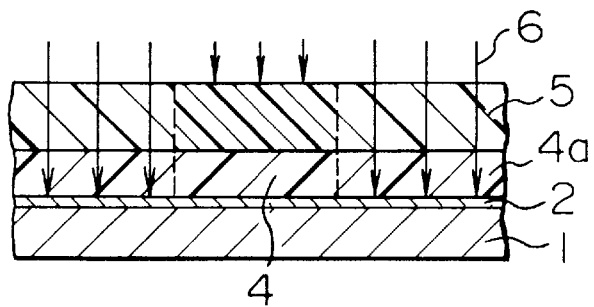

The photoresist 4 was exposed to ultraviolet light (UV) 6 (wavelength 365 nm) at a dose of 100–300 mJ/cm² through a photo mask 5 imagewise. At this time, the exposed portion 4a of the photoresist 4 was cured by polymerization reaction as shown in FIG. 2B (step 102 in FIG. 1).

Figure 2C:
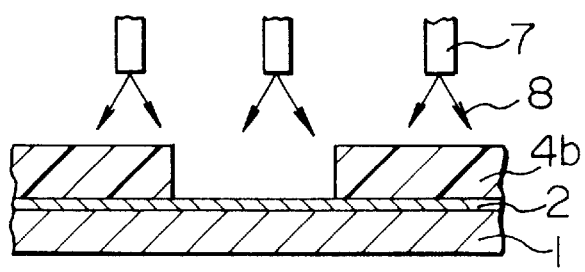

When the exposed portion 4a of the photoresist became a stable state about 30 minutes after exposure to UV, development by spraying a developer 8 from a spray nozzle 7 was conducted as shown in FIG. 2C to form a plating resist 4b as shown in FIG. 2C (step 103 in FIG. 1). As the developer, a mixture of 3 to 15 g/l. of $Na_2B_4O_7.10H_2O$, 70 to 900 ml/l. of diethylene glycol monobuthyl ether, and deionized water, a total being 1 liter, were used.

Figure 2D:
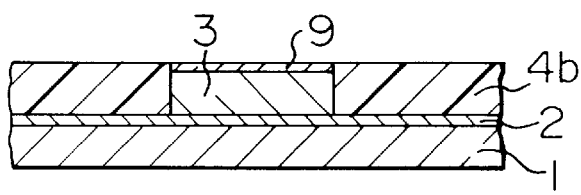

Then, pattern copper plating 3 was formed by a conventional electroless copper plating (pH 12 to 13, temperature 72° C.), followed by formation of a solder plating film 9 by a conventional electroplating on the pattern copper plating 3 as shown in FIG. 2D (step 104 in FIG. 1).

Figure 2E:
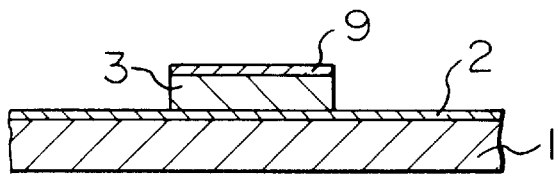

After formation of the solder plating film 9, unnecessary plating resist 4b was removed using, for example, using a non-aqueous solvent such as methylene chloride or dichloromethane, as shown in FIG. 2E (step 105 in FIG. 1). Alternatively, the plating resist 4b can also be removed by, e.g. $H_2SO_4$ (90%) solution, plasma treatment using $O_2$ gas (step 105).

Figure 2F:
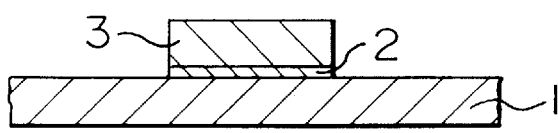

Then, the copper foil 2 was subjected to etching using as an etchant containing, e.g., 1.8–2.2% of $H_3PO_4$, 5.6–6.0% of $H_2O_2$, and 2.0–4.0% of $H_2SO_4$, or the like, followed by removal of unnecessary solder plating film 9 used as an etching resist was removed by using a solder removing solution, e.g. S-651A, S-651B (mfd. by Meltex Inc.) to complete a printed wiring board wherein copper wiring by the pattern copper plating 3 on the copper foil 2 of substrate 1 as shown in FIG. 2F (step 106 in FIG. 1).

In the above-mentioned step 101, when a copolymer of methyl methacrylate and methacrylic acid (methacrylic acid content: 6 to 10 parts per 100 parts of the copolymer) was used as a major component as the photo resist 4, and the steps 102 to 104 were conducted in the same manner as mentioned above, the plating resist 4b was peeled in the step 105 using a solution obtained by dissolving 5 g/l. of NaOH, 140 to 150 ml/l. of diethylene glycol monobutyl ether, 50 to 60 ml/l. of monoethanolamine in deionized water (in an amount necessary for making the whole amount 1 liter). Subsequently, the same step 106 as mentioned above was conducted to finally obtain a printed wiring board forming copper wiring on the copper foil 2 on the substrate 1 by pattern copper plating 3.

As mentioned above, by using the developer 8 comprising $Na_2B_4O_7.10H_2O$, diethylene glycol monobutyl ether and deionized water from the spray nozzle 7, the use of 1,1,1-trichloroethane, which causes the depletion of the ozone layer, can be abolished.

Further, the removal of solder plating film 9 used as the etching resist, as well as the removal of plating resist 4b after formation of pattern copper plating 3, can be conducted easily.

EXAMPLE 2

The process for producing a printed wiring board by a full-additive process is explained referring to FIGS. 3A to 3D.

Figure 3A:
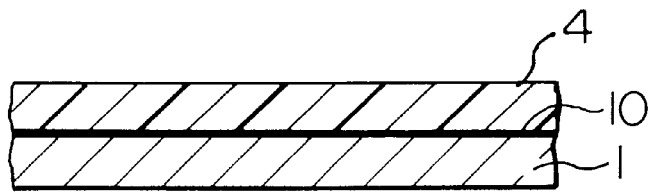
FIGS. 3A to 3D are cross-sectional views for explaining the process of the present invention by a fulladditive process.

An adhesive (10)-clad substrate 1 (glass-epoxy), e.g. AP-1530 (a trade name, mfd. by Hitachi Chemical Co., Ltd.), was exposed to UV light (wavelength 365 nm, dose 1.0–1.2 J/cm$^2$), followed by baking at 150° C. for 30 minutes to cure the adhesive. Then, a catalyst for plating such as Pd, etc. was seeded on the adhesive 10, followed by lamination of a dry film resist 4 (a copolymer of methyl methacrylate and methacrylic acid: methacrylic acid content 1.5–6 parts per 100 parts of copolymer) (FIG. 3A).

Figure 3B:
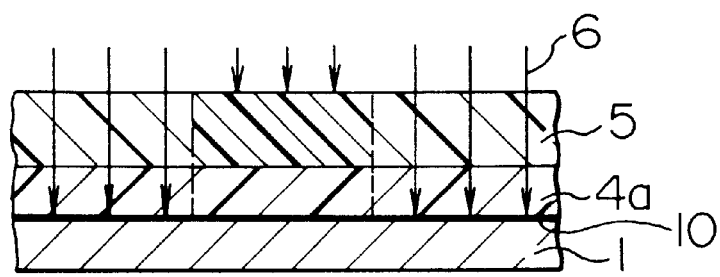
Figure 3C:
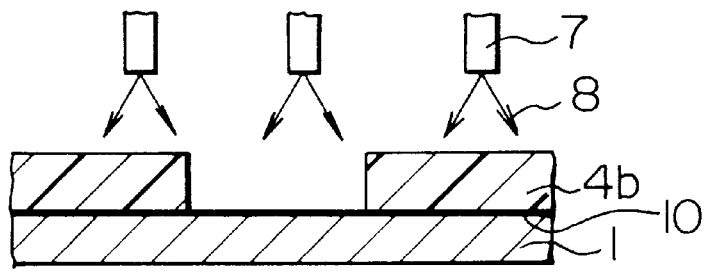
Figure 3D:
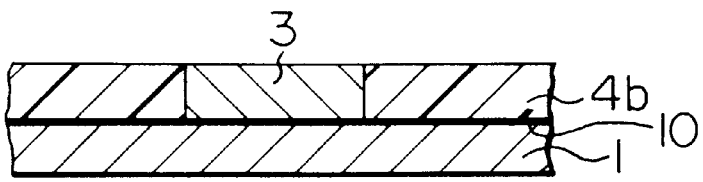

Then, as shown in FIG. 3B, the photoresist 4 was exposed to UV (wavelength 365 nm) via a photomask 5 (100–300 mJ/cm$^2$) imagewise. Then, the same developer 8 as used in Example 1 was sprayed from a spray nozzle 7 to conduct development for forming a plating resist 4b (FIG. 3C). Then, as shown in FIG. 3D, pattern copper plating 3 was formed by electroless copper plating as in Example 1.

When the plating resist 4b was peeled thereafter, said plating resist being formed by using a copolymer of methyl methacrylate and methacrylic acid (content: 1.5 to 6 parts), it was easily peeled by using a non-aqueous solvent such as dichloromethane. On the other hand, when a dry film resist containing mainly a copolymer of methyl methacrylate and methacrylic acid (the methacrylic acid content being 6 to 10 parts per 100 parts of the copolymer) was used as the photo resist 4 and the same steps as mentioned above were conducted to form the pattern copper plating 3, followed by peeling of the plating resist, easy peeling of the plating resist 4b was possible using as a peeling solution a mixed solvent of an alkaline aqueous solution and a chlorine-free organic solvent, for example, having the following composition:

| | |
|---|---|
| NaOH | 5 g/l. |
| Diethyleneglycol monobutyl ether | 140–150 ml/l. |
| Monoethanolamine | 50–60 ml/l. |
| Deionized water | an amount necessary for making the total amount 1 liter. |

In the above-mentioned Example, the plating resist 4b can be used as a permanent resist without peeling off.

The present invention was illustrated by way of the above-mentioned Examples, but, needless to say, the present invention is not limited to the Examples and various modifications are possible within the gist of the present invention.

For example, as the chlorine-free developer 8, it is possible to use other water-soluble chlorine-free organic solvent in addition to the ethylene glycol ethers such as diethylene glycol monobutyl ether, propylene glycol ethers and alkaline aqueous solutions.

In addition, as to the plating resist 4b, the resist materials are not limited to copolymers of methyl methacrylate and methacrylic acid, and various resist materials can further be used so long as these materials can be developable using a developer comprising a chlorine-free organic solvent and an alkaline aqueous solution.

According to the present invention, the following effects can be obtained.

(1) Since there is used the resist material which is developable by a developer comprising a chlorine-free organic solvent and alkaline aqueous solution, it is not necessary to conduct a special curing treatment to the plating resist in order to improve resistance to plating bath after development. Thus, simplification of pattern forming steps becomes possible.

(2) Since the special curing treatment for the plating resist is not necessary as mentioned in above (1), the peeling of plating resist after formation of solder plating film used as etching resist on pattern copper plating becomes easy.

(3) Since the developer comprising a chlorine-free organic solvent and an alkaline aqueous solution is used as mentioned in above (1), the use of 1,1,1-trichloroethane which is a cause of depletion of the ozone layer can be abolished. Thus, a problem of inhibition of some kinds of developers can be solved.

(4) Since the problem of using chlorine-containing developers is solved and simplification of production steps and easy peeling of plating resist become possible as mentioned in above (1) to (3), it is possible to easily produce printed wiring boards with a large area of substrate and fine patterns formed by pattern copper plating method.

What is claimed is:

1. A chemical composition which is curable by polymerization reaction when it is exposed to ultraviolet light, wherein the composition comprises (A) mainly a copolymer of methyl methacrylate and methacrylic acid, and (B) a photosensitive monomer which is responsive to ultraviolet light, and wherein said methacrylic acid is about 1.0 to 11 parts by weight per 100 parts by weight of the copolymer.

2. A chemical composition according to claim 1, wherein the content of methacrylic acid is about 1.5 to 6 parts by weight per 100 parts by weight of the copolymer.

3. A chemical composition according to claim 1, wherein the compound is cured by ultraviolet light having a wavelength of 365 nm.

4. A chemical composition according to claim 2, wherein the compound is cured by ultraviolet light having a wavelength of 365 nm.

5. A chemical composition which is curable by a polymerization reaction when the compound is exposed to ultraviolet light, wherein the composition consists essentially of (A) a copolymer consisting of methyl methacrylate, methacrylic acid, and (B) a photosensitive monomer which is responsive to ultraviolet light, the content of methacrylic acid being about 1.0 to 11 parts by weight per 100 parts by weight of the copolymer; said compound being cured by ultraviolet light having a wavelength of 365 nm.

6. A chemical composition which is curable by ultraviolet light, wherein the composition comprises (A) mainly a copolymer of methyl methacrylate and methacrylic acid, and (B) a photosensitive monomer which is responsive to ultraviolet light, and wherein said methacrylic acid is about 1.0 to 11 parts by weight per 100 parts by weight of the copolymer.

7. A chemical composition according to claim 6, wherein the photosensitive monomer is responsive to ultraviolet light having a wavelength of 365 nm.

8. A chemical composition according to claim 6, wherein the photosensitive monomer is at least one member selected from the group consisting of allyloxylated cyclohexyl diacrylate, bis(acryloxy ethyl) hydroxyethylisocyanurate, bis(acryloxy neophentyldiglycol) adipate, ethylene oxide modified bisphenol A diacrylate, ethylene oxide modified bisphenol S diacrylate, bisphenol A dimethacrylate, ethylene oxide modified bisphenol A dimethacrylate, ethylene oxide modified bisphenol F diacrylate, 1,4-butanediol diacrylate, 1,4-butanediol dimethacrylate, 1,3-butyleneglycol diacrylate, 1,3-butyleneglycol dimethacrylate, dicyclopentanyl diacrylate, diethyleneglycol diacrylate, diethyleneglycol dimethacrylate, ethylene oxide hydroxy modified diethyleneglycol dimethacrylate, dipentaerythritol hexaacrylate and dipentaerythritol monohydroxy pentaacrylate.

9. A resist material comprising (A) a copolymer of methyl methacrylate and methacrylic acid containing methacrylic acid in an amount of 1.0 to 11 parts by weight per 100 parts by weight of the copolymer, and (B) a photosensitive monomer which is responsive to ultraviolet light, said resist material being curable by polymerization upon exposure to ultraviolet light.

10. The resist material according to claim 9, wherein said resist material is developable with a developer comprising a chlorine free organic solvent and an alkaline aqueous solution.

11. The resist material according to claim 9, wherein the thermal expansion coefficient of said resist material is $1 \times 10^{-4}$ or less and swelling of said material with a plating solution is 10% or less.

12. The resist material according to claim 10, wherein said chlorine free organic solvent is selected from the group consisting of diethylene glycol monobutyl ether, ethylene glycol monobutyl ether, propylene glycol methyl ether, dipropylene glycol methyl ether and tripropylene glycol methyl ether.

13. The resist material according to claim 11, wherein the plating solution is selected from the group consisting of methylene chloride, dichloromethane, a mixture of a chlorine-free organic solvent and an alkaline aqueous solution, and a mixture of a chlorine-free organic solvent, an alkaline aqueous solution and one or more amine compounds.

* * * * *